United States Patent
Kuo et al.

(10) Patent No.: US 7,746,646 B2
(45) Date of Patent: Jun. 29, 2010

(54) SECURING DEVICE FOR ASSEMBLING HEAT DISSIPATION MODULE ONTO ELECTRONIC COMPONENT

(75) Inventors: Jer-Haur Kuo, Taipei Hsien (TW); Xin-Xiang Zha, Shenzhen (CN); Ye-Fei Yu, Shenzhen (CN); Lin Yang, Shenzhen (CN); Fang-Xiang Yu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/256,462

(22) Filed: Oct. 22, 2008

(65) Prior Publication Data

US 2009/0279263 A1 Nov. 12, 2009

(30) Foreign Application Priority Data

May 9, 2008 (CN) .................... 2008 1 0067114

(51) Int. Cl.
*H05K 7/20* (2006.01)
*H01L 23/40* (2006.01)

(52) U.S. Cl. .................. 361/709; 361/679.54; 361/704; 361/707; 361/710; 165/80.3; 165/185; 174/16.3; 174/252; 257/707; 257/718

(58) Field of Classification Search ............ 361/679.46, 361/679.54, 702–712, 715, 717–719, 722–724; 165/80.2, 80.4, 80.5, 104.33, 185, 80.3; 257/706–727; 174/15.1, 16.3, 252; 24/295, 296, 455–459, 24/517, 625; 411/338, 505–510, 339, 525, 411/526, 512; 248/505, 510, 316.7, 271; 29/525.01–525.04

See application file for complete search history.

(56) References Cited

U.S. PATENT DOCUMENTS

| | | | | | |
|---|---|---|---|---|---|
| 5,933,325 | A | * | 8/1999 | Hou | 361/704 |
| 5,953,212 | A | * | 9/1999 | Lee | 361/709 |
| 6,208,518 | B1 | * | 3/2001 | Lee | 361/704 |
| 6,341,065 | B1 | * | 1/2002 | Lo | 361/704 |
| 6,430,049 | B1 | * | 8/2002 | Lai et al. | 361/704 |
| 6,456,493 | B1 | * | 9/2002 | Lee | 361/704 |

(Continued)

FOREIGN PATENT DOCUMENTS

FR 002813383 A3 * 3/2002

*Primary Examiner*—Michael V Datskovskiy
(74) *Attorney, Agent, or Firm*—Frank R. Niranjan

(57) ABSTRACT

A securing device (30) is used for securing a heat sink (10) to a printed circuit board (40) with a heat-generating electronic component (41) mounted thereon. The securing device includes a V-shaped elongated main body (31), a first locking leg (34), a second locking leg (332) and a resilient member (32). The first locking leg and second locking leg are connected to two opposite ends of the main body respectively for engaging with a retention frame (20) on the printed circuit board. The resilient member includes a planar-shaped supporting plate (321) engaging with a bottom portion of the main body and at least one resilient foot (322) extending downwardly from the supporting plate. The resilient foot deforms to exert a resilient force on the heat sink when the heat sink is assembled to the electronic component by the securing device.

19 Claims, 7 Drawing Sheets

U.S. PATENT DOCUMENTS

| | | | | |
|---|---|---|---|---|
| 6,462,945 B2 * | 10/2002 | Sloan et al. | | 361/679.54 |
| 6,483,703 B2 * | 11/2002 | Hsu | | 361/704 |
| 6,644,387 B1 * | 11/2003 | Lee et al. | | 165/80.3 |
| 6,778,395 B1 * | 8/2004 | Dong et al. | | 361/704 |
| 6,950,301 B2 * | 9/2005 | Bossio | | 361/761 |
| 7,009,843 B2 * | 3/2006 | Lee et al. | | 361/704 |
| 7,215,550 B1 * | 5/2007 | Yang et al. | | 361/704 |
| 7,280,361 B1 * | 10/2007 | Lin | | 361/704 |
| 7,292,442 B2 * | 11/2007 | Yu et al. | | 361/704 |
| 7,375,965 B2 * | 5/2008 | Xia et al. | | 361/704 |
| 7,391,615 B2 * | 6/2008 | Fu et al. | | 361/704 |
| 7,409,751 B2 * | 8/2008 | Chen et al. | | 24/455 |
| 7,409,752 B2 * | 8/2008 | Chen | | 24/459 |
| 7,414,847 B2 * | 8/2008 | Xia et al. | | 361/704 |
| 7,430,121 B2 * | 9/2008 | Lu et al. | | 361/719 |
| 7,478,667 B2 * | 1/2009 | Yang | | 165/80.2 |
| 7,564,689 B1 * | 7/2009 | Guo et al. | | 361/704 |
| 7,576,987 B2 * | 8/2009 | Lai et al. | | 361/704 |
| 7,604,041 B2 * | 10/2009 | Yu et al. | | 165/80.3 |
| 7,613,005 B2 * | 11/2009 | Kuo et al. | | 361/719 |

* cited by examiner

SECURING DEVICE FOR ASSEMBLING HEAT DISSIPATION MODULE ONTO ELECTRONIC COMPONENT

BACKGROUND

1. Field of the Disclosure

The disclosure generally relates to securing devices, and particularly to a securing device for assembling a heat dissipation module onto a heat-generating electronic component.

2. Description of Related Art

It is well known that heat is generated during operations of a variety of electronic components, such as central processing units (CPUs). To ensure normal and safe operations, heat dissipation modules such as heat sinks are often employed to dissipate the generated heat away from these electronic components, and securing devices are often employed to assemble the heat dissipation modules onto these electronic components.

A conventional way to secure the heat dissipation module onto the electronic component is to screw a base of the heat dissipation module onto a printed circuit board (PCB) on which the electronic component is mounted. However, a force exerted on the electronic component is hard to control. If the force is greater than a predetermined value, the electronic component will be damaged. If the force is smaller than the predetermined value, an intimate contact between the heat sink and the electronic component will not be kept.

What is needed, therefore, is a securing device for assembling a heat dissipation module to an electronic component which overcomes the described limitations.

SUMMARY

A securing device is used for securing a heat sink to a printed circuit board with a heat-generating electronic component mounted thereon. The securing device includes a V-shaped elongated main body, a first locking leg, a second locking leg and a resilient member. The first locking leg and second locking leg are connected to two opposite ends of the main body respectively for engaging with a retention frame on the printed circuit board. The resilient member includes a planar-shaped supporting plate engaging with a bottom portion of the main body and at least one resilient foot extending downwardly from the supporting plate. The resilient foot deforms to exert a resilient force on the heat sink when the heat sink is assembled to the electronic component by the securing device.

Other advantages and novel features of the present invention will become more apparent from the following detailed description of embodiments when taken in conjunction with the accompanying drawings.

DETAILED DESCRIPTION

Figure 1:
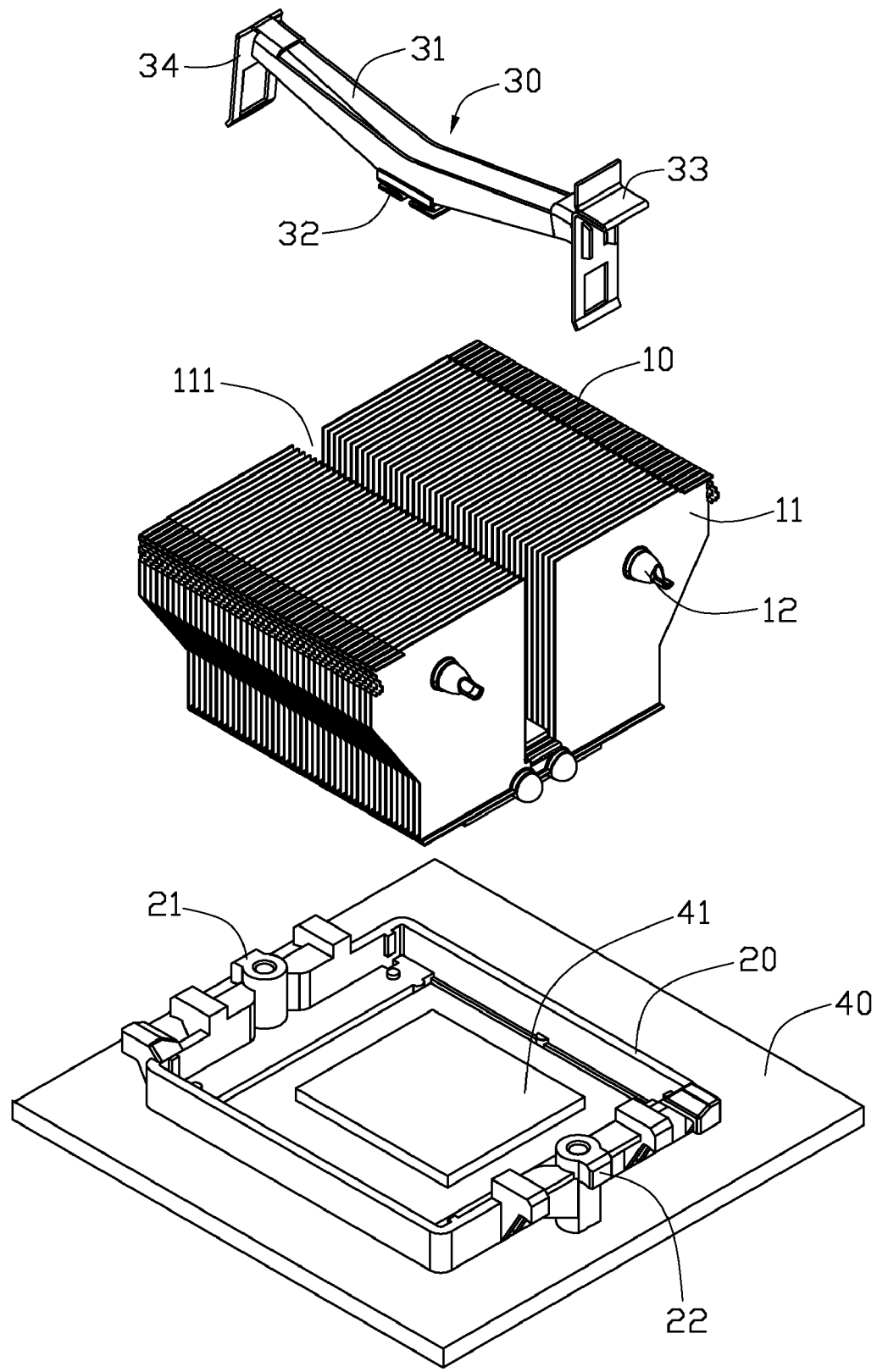
FIG. 1 is a partially exploded, isometric view of a heat dissipation module in accordance with a first embodiment, together with a heat-generating electronic component mounted on a PCB.
Figure 2:
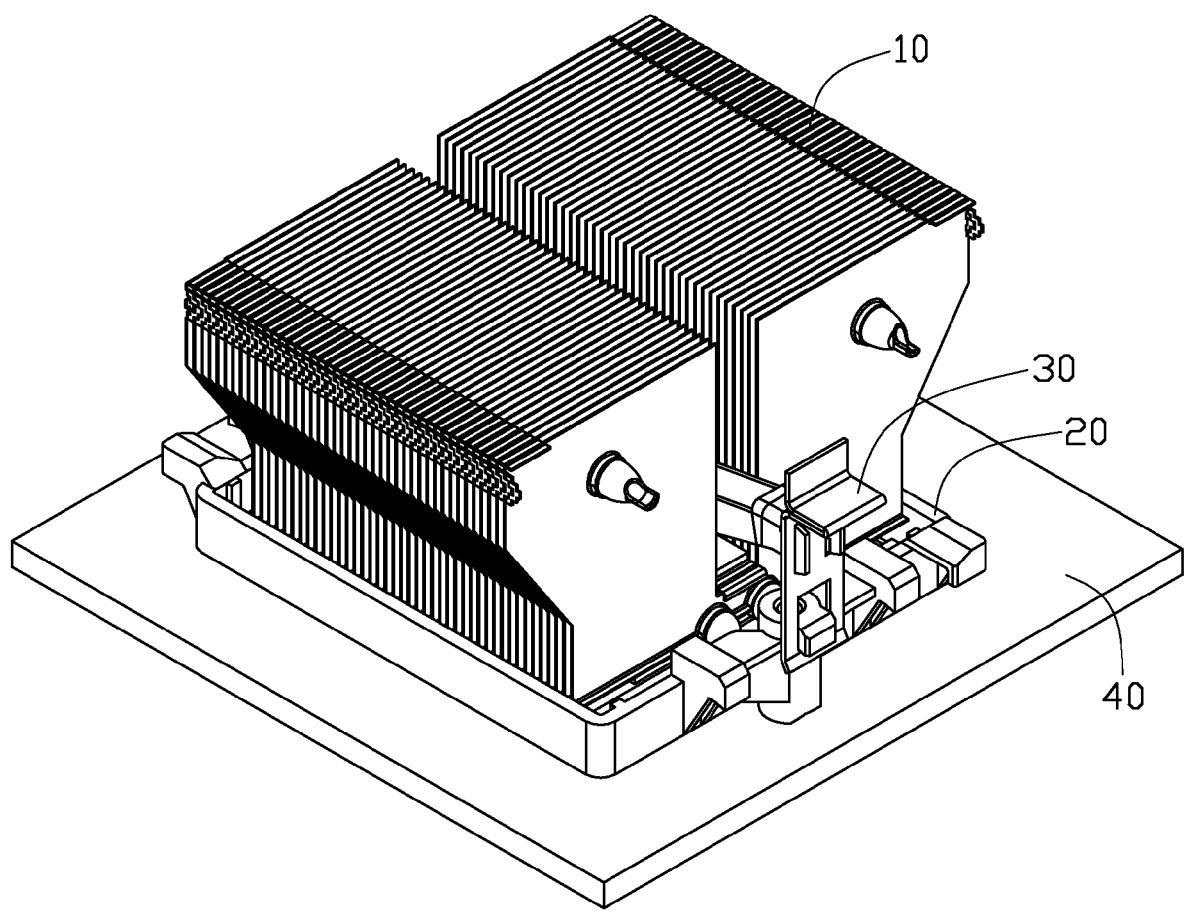
FIG. 2 shows the heat dissipation module assembled to the electronic component on the PCB of FIG. 1.

Referring to FIGS. 1 and 2, a heat dissipation module in accordance with a first embodiment is shown. The heat dissipation module includes a heat sink 10, a retention frame 20, and a securing device 30. The heat sink 10 is positioned on an electronic component 41 which is mounted on a PCB 40, for dissipating heat generated by the electronic component 41. The securing device 30 is used to secure the heat sink 10 to the electronic component 41.

The heat sink 10 includes a fin assembly 11 and a plurality of heat pipes 12 inserted in the fin assembly 11. The fin assembly 11 of the heat sink 10 defines an elongated locating groove 111 through a middle portion of the fin assembly 11 for receiving the securing device 30 therein.

The electronic component 41 is surrounded by the retention frame 20 which is securely mounted on the PCB 40. The retention frame 20 is substantially rectangular shaped. A pair of catches 21, 22, i.e., first catch 21 and second catch 22 extend outwardly from two opposite ends of the retention frame 20, respectively.

Figure 3:
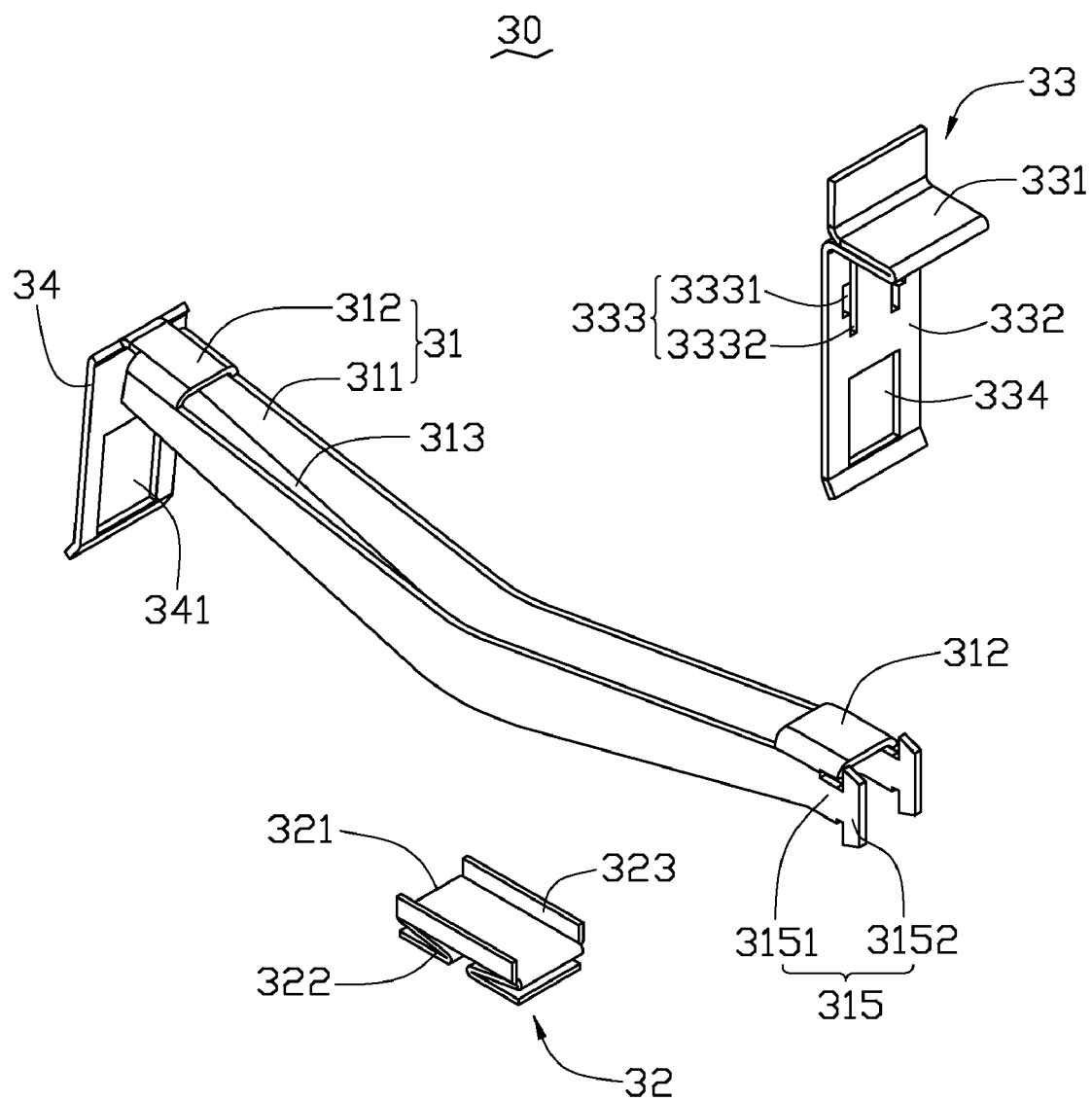
FIG. 3 is an exploded, isometric view of a securing device of the heat dissipation module of FIG. 1.

Referring to FIG. 3, the securing device 30 includes an elongated main body 31, a resilient member 32, a first locking leg 34 and a moveable locking member 33. The main body 31 defines an elongated cutout 313 therein for saving material and increasing resilience. The main body 31 includes a pair of elongated resilient arms 311 and two connecting planes 312. The resilient arms 311 are of substantially V-shaped sheets parallel to each other. The connecting planes 312 are located at two opposite end (i.e., left and right ends) of the main body 31 respectively and interconnect the pair of resilient arms 311. The first locking leg 34 is integrally formed with and bent perpendicularly from a first end (i.e., left end) of the main body 31. The first locking leg 34 defines a first securing hole 341 adjacent to a bottom end thereof. The main body 31 forms two T-shaped barbs 315 at a second end (i.e., right end) thereof. Each of the two barbs 315 extends integrally from a right end of one resilient arm 311. Each of the barbs 315 includes a neck 3151 connecting with the resilient arm 311 and a locking end 3152 formed at a free end of the barb 315. In a vertical direction, top and bottom ends of the locking end 3152 extend beyond those of the neck 3151, respectively.

The moveable locking member 33 is movably coupled with the barbs 315 of the main body 31. The movable locking member 33 includes an L-shaped operating portion 331 and a second locking leg 332. The second locking leg 332 is integrally formed with and extends downwardly from the operating portion 331. The second locking leg 332 defines two T-shaped connecting slots 333 in a top portion thereof for engagingly receiving the barbs 315 of the main body 31. The two connecting slots 333 are located adjacent to two lateral sides of the second locking leg 332, respectively. Each of the connecting slots 333 includes a longitudinally narrow portion 3331 and a longitudinally wide portion 3332 at an inner side of the narrow portion 3331. A distance between the narrow portions 3331 of the two connecting slots 333 is not greater than a distance between the two barbs 315. In a vertical direction, a length of the narrow portion 3331 of the connecting slot 333 is smaller than that of the locking end 3152 and is not smaller than that of the neck 3151. The second locking leg 332 defines a second securing hole 334 therein below the two connecting slots 333 for engaging with the second catch 22 of the retention frame 20.

Figure 4:
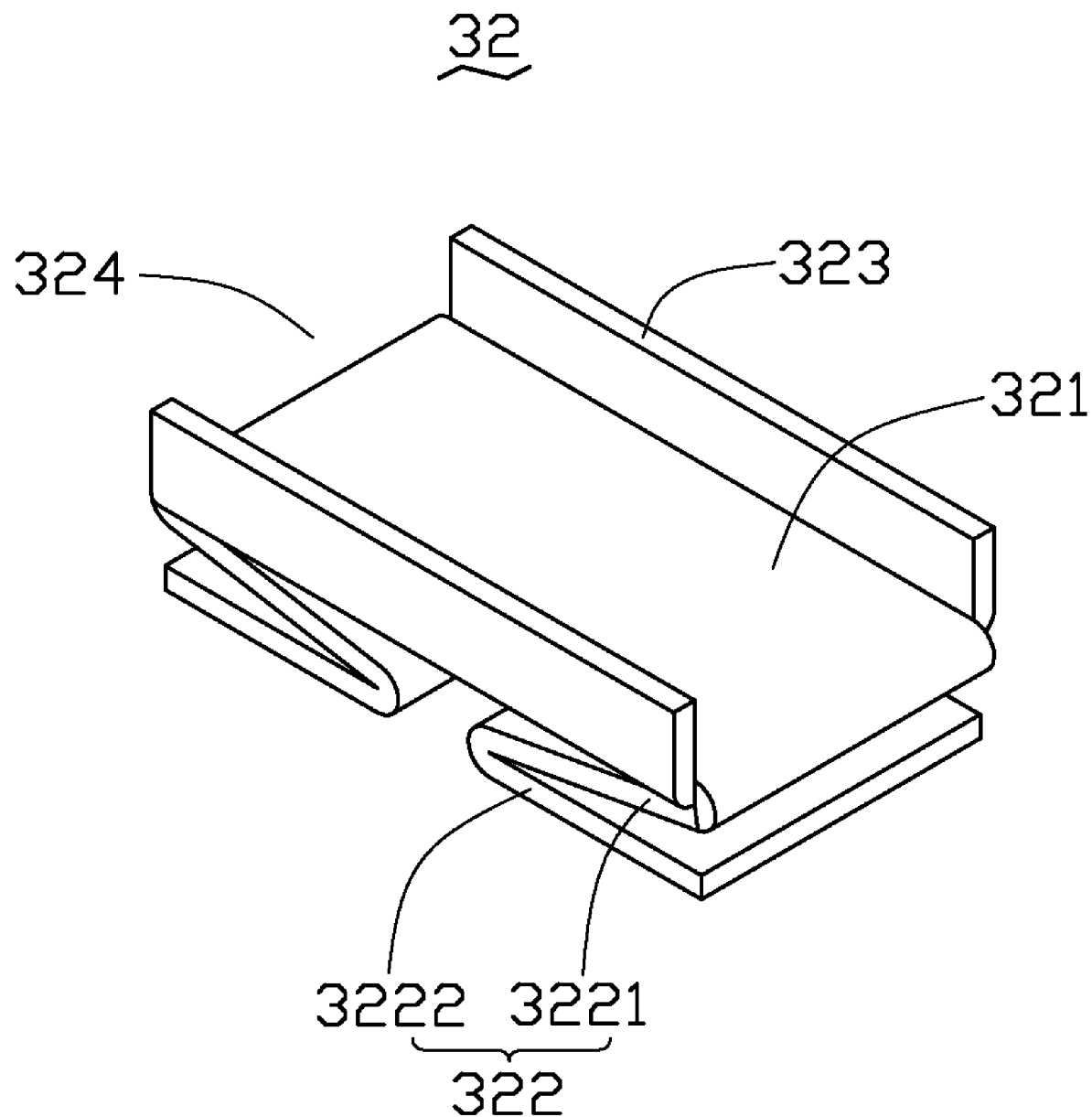
FIG. 4 is an enlarged view of a resilient member of the securing device of FIG. 3.

Referring to FIG. 4, the resilient member 32 is formed by continuously bending a metal plate so that the resilient member 32 is monolithic. The resilient member 32 includes a supporting plate 321 and two V-shaped resilient feet 322 integrally disposed below the supporting plate 321. The supporting plate 321 is substantially rectangular shaped. Two baffles 323 extend upwardly from two opposite sides (i.e., front and rear sides) of the supporting plate 321. A receiving space 324 is formed between the two baffles 323 and above the supporting plate 321 for receiving the pair of resilient arms 311 of the main body 31 therein. A distance between inner sides of the two baffles 323 is slightly smaller than a distance between outer sides of the pair of resilient arms 311. The two resilient feet 322 are formed at two opposite ends (i.e., left and right ends) of the supporting plate 321. Each of the resilient feet 322 includes a planar first bending portion 3221 and a planar second bending portion 3222. The first bending portion 3221 extends downwardly and inwardly from the left end of the supporting plate 321, and the second bending portion 3222 extends downwardly and outwardly from a right end of the first bending portion 3221. The second bending portions 3222 are horizontally extended outwardly from bottom ends of the first bending portions 3221, respectively.

In pre-assembly of the securing device 30, the two barbs 315 are pressed inwardly toward each other so that a distance therebetween is reduced. When the two barbs 315 are aligned with the wide portions 3332 of the two connecting slots 333 respectively, the barbs 315 are brought to extend into the wide portions 3332 of the T-shaped connecting slots 333. After the locking ends 3152 of the two barbs 315 fully pass through the wide portions 3332 of the T-shaped connecting slots 333, the necks 3151 of the two barbs 315 slide into the narrow portions 3331 of the two T-shaped connecting slots 333 respectively by releasing the pressing force on the barbs 315. Thus the barbs 315 restore to their original positions and engage with the second locking leg 332 of the locking member 33. Middle portions of the pair of resilient arms 311 are interferentially received in the receiving space 324 of the resilient member 32. Because the distance between inner sides of the two baffles 323 is slightly smaller than the distance between outer sides of the pair of resilient arms 311, the resilient member 32 engages with middle portions of the resilient arms 311 of the main body 31 due to the elastic force provided by the compressed resilient arms 311.

Referring back to FIGS. 1-2, in assembly, the heat sink 10 is placed on the electronic component 41. The connected resilient member 32 and resilient arms 311 of the securing device 30 are placed in the locating groove 111 of the heat sink 10. The first securing hole 341 of the first locking leg 34 loosely receives the first catch 21 of the retention frame 20. The operating portion 331 of the moveable locking member 33 is pressed to drive the second locking leg 332 to move downwardly until the second locking leg 332 engages with the second catch 22 of the retention frame 20. The supporting plate 321 of the resilient member 32 is depressed downwardly by the resilient arms 311. Meanwhile, the resilient feet 322 are deformed and a height of the resilient feet 322 is decreased. Thus, a resilient force generated by the resilient feet 322 urges the heat sink 10 downwardly toward the PCB 40, thereby securing the heat sink 10 onto the electronic component 41. Meanwhile, the resilient force generated by the resilient feet 322 urges the securing device 30 to move upwardly, causing the first and second locking legs 34, 332 to have a tight engagement with the first and second catches 21, 22.

In the present heat dissipation module, the resilient member 32 is arrange between the resilient arms 311 and the heat sink 10. The heat sink 10 is urged toward the electronic component 41 mainly by resilient force generated by the resilient feet 322 of the resilient member 32. The amount of the resilient force can be controlled by controlling the degree of the deformation of the resilient feet 322. Furthermore, the securing device 30 contacts with the heat sink 10 by the planar second bending portion 3222 of the resilient member 32, which increases the effective contacting area of the securing device 30 and the heat sink 10. Therefore, the resilient force produced by the securing device 30 can be more evenly applied to the heat sink 10 to thereby make the heat sink 10 intimately contact with the electronic component 41 with a more uniform pressure distribution thereon.

Figure 5:
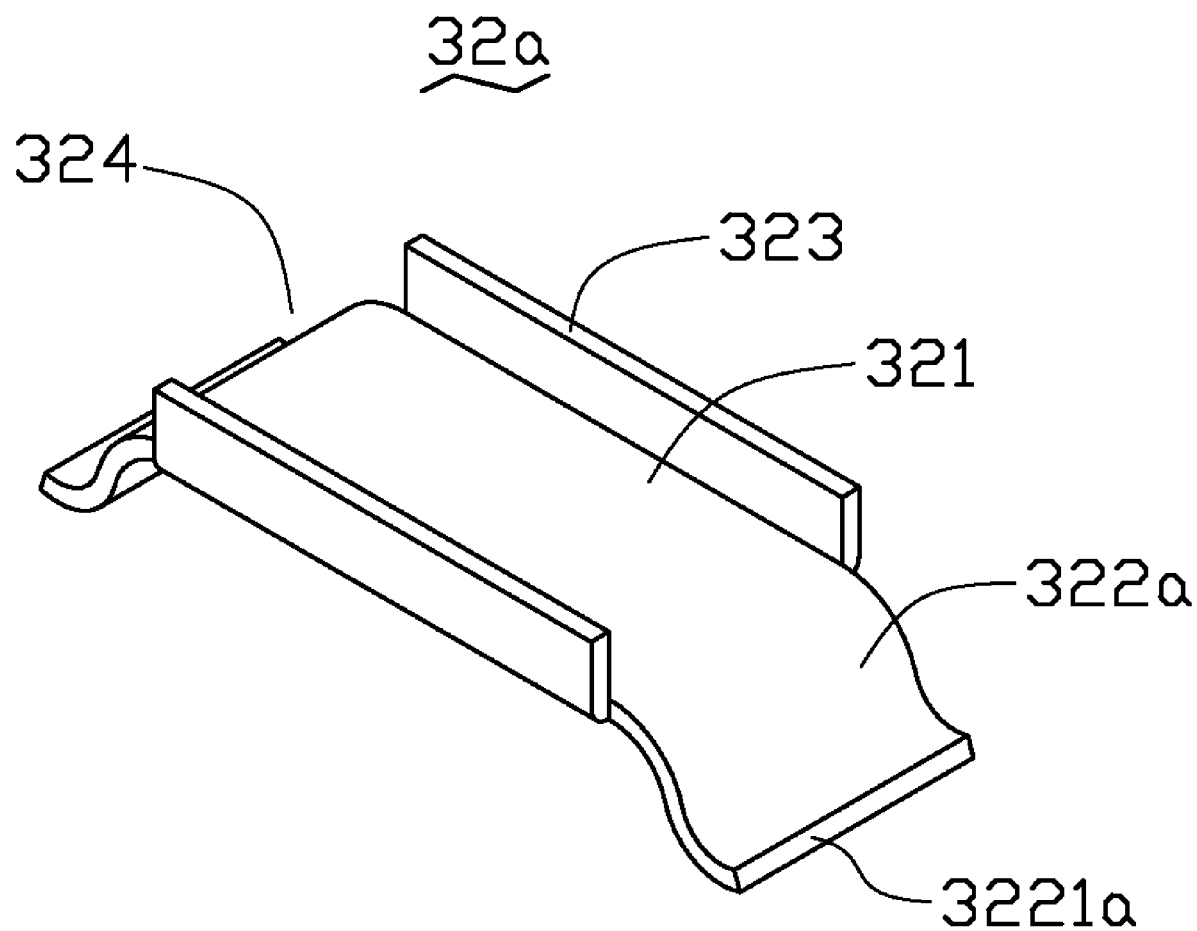
FIG. 5 is a view similar to FIG. 4, showing a resilient member in accordance with a second embodiment.

Referring to FIG. 5, a second embodiment of a resilient member 32a is shown. The difference between the second embodiment and the first embodiment is: in the second embodiment, each of the resilient feet 322a is substantially S-shaped in profile and extends downwardly and outwardly from an outer end of the supporting plate 321. In use of the securing device 30 incorporating the resilient member 32a, the S-shaped resilient feet 322a are deformed to cause free ends 3221a of the resilient feet 322a to urge the heat sink 10 toward the electronic component 41.

Figure 6:
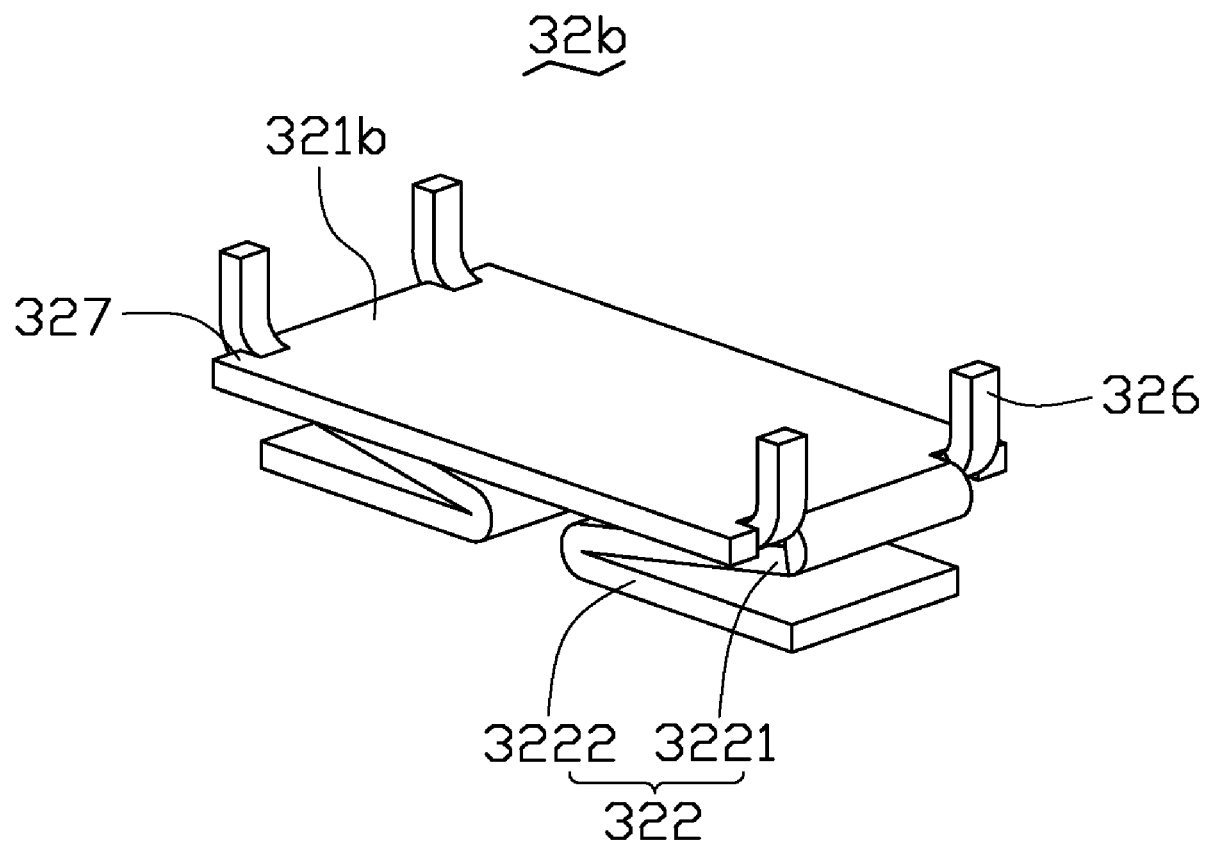
FIG. 6 is a view similar to FIG. 4, showing a resilient member in accordance with a third embodiment.

Referring to FIG. 6, a third embodiment of a resilient member 32b is shown. The difference between the third embodiment and the first embodiment is: in the third embodiment, there are four protruding poles 326 extending upwardly from four corners of a supporting plate 321b, instead of the baffles 323. The four protruding poles 326 are located at two opposite ends (i.e., left and right ends) of the supporting plate 321b. A distance between outer sides of two protruding poles 326 at each end of the supporting plate 321b is slightly greater than the distance between inner sides of the pair of the resilient arms 311. In pre-assembly of the securing device, the protruding poles 326 are interferentially received in the elongated cutout 313 of the main body 31 and bottom ends of the pair of resilient arms 311 abut against outer edges 327 of the supporting plate 321b.

Figure 7:
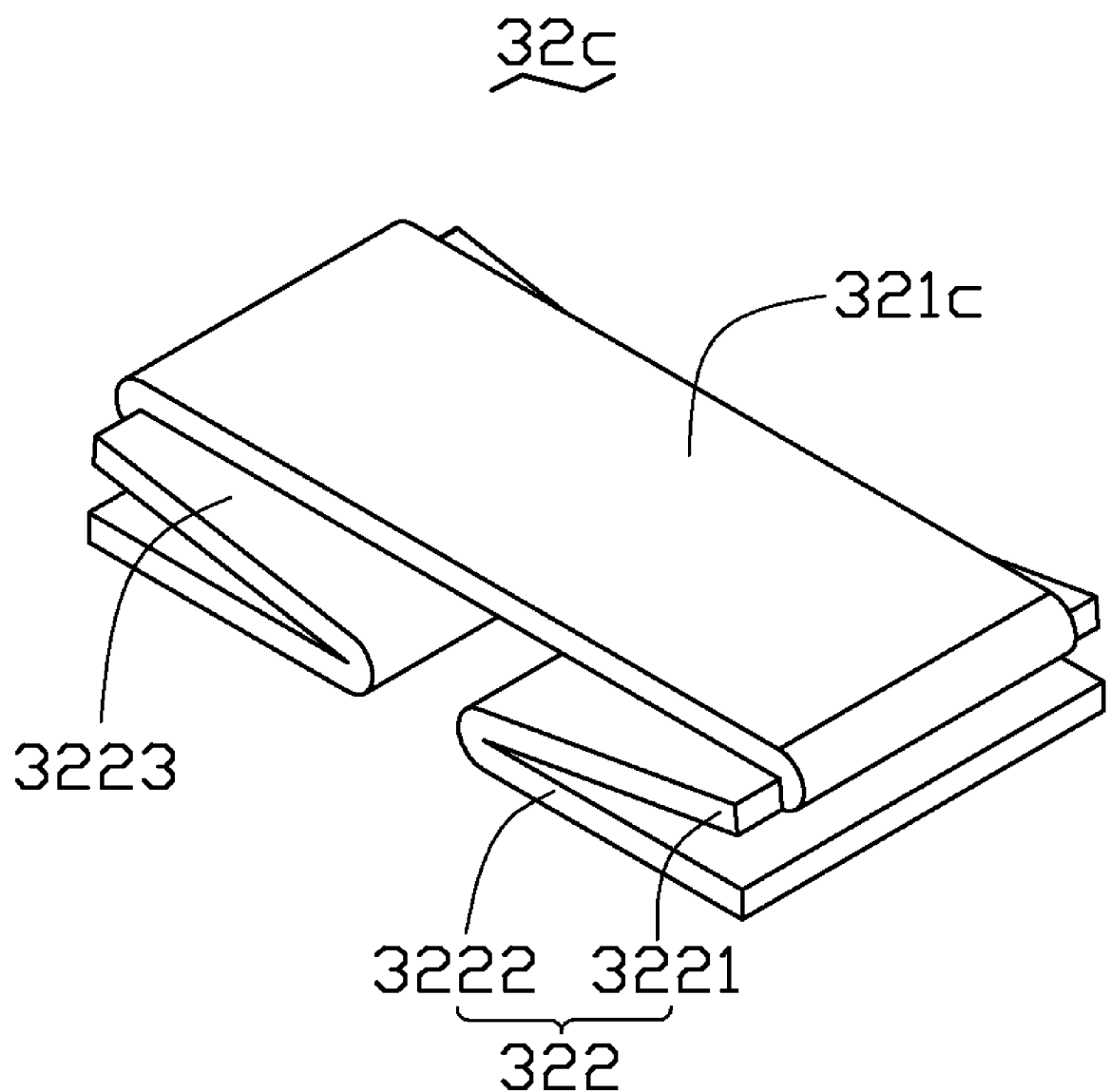
FIG. 7 is a view similar to FIG. 4, showing a resilient member in accordance with a fourth embodiment.

Referring to FIG. 7, a fourth embodiment of a resilient member 32c is shown. The difference between the fourth embodiment and the first embodiment is: in the fourth embodiment, a supporting plate 321c is planar-shaped, and front and rear edges 3223 of the resilient feet 322 extend beyond those of supporting plate 321c. A width of the supporting plate 321c between front and rear sides thereof is slightly greater than the distance between inner sides of the pair of the resilient arms 311. In pre-assembly of the fastening device, the supporting plate 321c is interferentially received in the elongated cutout 313 of the main body 31 and the pair of resilient arms 311 of the main body 31 abut against front and rear edges 3223 of the resilient feet 322. Alternatively, the resilient members 32, 32a, 32b, 32c of the above-mentioned embodiments may include more than two bending portions.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A securing device configured for securing a heat sink to a printed circuit board on which an electronic component is mounted, the securing device comprising:
   a V-shaped elongated main body;
   a first locking leg extending from a first end of the main body adapted for engaging with a retention frame on the printed circuit board,
   a second locking leg extending from an opposing second end of the main body adapted for engaging with the retention frame on the printed circuit board; and
   a resilient member comprising a planar-shaped supporting plate engaging with a bottom portion of the main body and at least one resilient foot extending downwardly from the supporting plate, the resilient foot being adapted for deforming to exert a resilient force on the heat sink when the securing device is used to mount the heat sink to the electronic component;
   wherein the at least one resilient foot comprises a pair of resilient feet extending from opposite sides of the supporting plate, the main body comprising a pair of elongated resilient arms, each of the resilient arms being substantially V-shaped, the resilient member interferentially engaging with middle portions of the pair of resilient arms of the main body.

2. The securing device of claim 1, wherein each of the resilient feet comprises a first bending portion extending downwardly and inwardly from an end of the supporting plate, and a planar second bending portion extending outwardly from an inner end of the first bending portion, the second bending portion being parallel to the supporting plate.

3. The securing device of claim 1, wherein, the resilient feet are S-shaped in profile, each of the resilient feet extending downwardly and outwardly from one of two opposite ends of the supporting plate.

4. The securing device of claim 1, wherein two baffles extend upwardly from two opposite sides of the supporting plate, a receiving space being formed between the two baffles and above the supporting plate, the pair of resilient arms of the main body being interferentially received in the receiving space.

5. The securing device of claim 1, wherein four protruding poles extend upwardly from four corners of the supporting plate, the main body defining an elongated cutout therein, the protruding poles being interferentially received in the elongated cutout of the main body, a bottom end of each resilient arm abutting against an outer edge of the supporting plate.

6. The securing device of claim 1, wherein front and rear edges of the resilient feet extend beyond those of the supporting plate, the main body defining an elongated cutout therein, the supporting plate being interferentially received in the elongated cutout, and the pair of resilient arms of the main body abutting against the front and rear edges of the resilient feet.

7. The securing device of claim 1, wherein the first locking leg is integrally formed with and depends from the first end of the main body and the second locking leg is formed on a moveable locking member which is movably coupled with the second end of the main body, the main body forming two barbs at the second end thereof, the second locking leg defining two connecting slots in a top portion thereof for engagingly receiving the barbs of the main body.

8. The securing device of claim 7, wherein each of the barbs extends vertically and comprises a neck connecting with the main body and a locking end, the locking end being formed at a free end of the barb, each of the connecting slots comprising a longitudinally narrow portion and a longitudinally wide portion beside the narrow portion, the barbs being inserted into the connecting slots through the wide portions of the slots, and the necks of the barbs being received in the narrow portions of the slots.

9. A heat dissipation module comprising:
   a retention frame configured for fixing to a printed circuit board on which a heat-generating electronic component is mounted, and surrounding the electronic component, the retention frame forming first and second catches at two opposite ends thereof, respectively;
   a head sink adapted for dissipating heat of the electronic component, the heat sink defining an elongated locating groove through a middle portion thereof; and
   a securing device adapted for securing the heat sink onto the electronic component, the securing device comprising:
     an elongated main body;
     a first locking leg extending from a first end of the main body and engaging with the first catch of the retention frame;
     a second locking leg extending from an opposing second end of the main body and engaging with the second catch of the retention frame; and
     a resilient member engaging with a middle portion of the main body, the main body and the resilient member being received in the locating groove of the heat sink and the resilient member being sandwiched between the main body and the heat sink, the resilient member comprising a supporting plate and two resilient feet integrally disposed below the supporting plate;
     wherein the resilient feet are deformed and adapted for providing a resilient force to urge the heat sink toward the electronic component.

10. The heat dissipation module of claim 9, wherein each of the resilient feet comprises a first bending portion extending downwardly and inwardly from an end of the supporting plate, and a planar second bending portion extending outwardly from an inner end of the first bending portion, the planar second bending portion being adapted for contacting the heat sink.

11. The heat dissipation module of claim 9, wherein the resilient feet are S-shaped in profile, each of the resilient feet extending downwardly and outwardly from one of two opposite ends of the supporting plate.

12. The heat dissipation module of claim 9, wherein the main body comprises a pair of elongated resilient arms, and two baffles extend upwardly from two opposite sides of the supporting plate, a receiving space being formed between the two baffles and above the supporting plate for receiving middle portions of the pair of resilient arms of the main body therein.

13. The heat dissipation module of claim 9, wherein the main body comprises a pair of elongated resilient arms and defines an elongated cutout between the pair of elongated resilient arms, two pairs of protruding poles each extending upwardly from two opposite ends of the supporting plate, the two pairs of protruding poles being received in the elongated cutout of the main body, and a middle portion of each resilient arm abutting against an outer edge of the supporting plate.

14. The heat dissipation module of claim 9, wherein front and rear edges of the resilient feet extend beyond those of the supporting plate, the main body defining an elongated cutout therein and comprising two resilient arms beside the cutout, the supporting plate being interferentially received in the elongated cutout, and the two resilient arms of the main body abutting against the front and rear edges of the resilient feet.

15. The heat dissipation module of claim 9, wherein the main body of the securing device comprises a pair of elongated resilient arms, each of the resilient arms being substantially V-shaped, the resilient member interferentially engaging with middle portions of the pair of resilient arms of the main body.

16. A securing device configured for securing a heat sink to a printed circuit board on which an electronic component is mounted, the securing device comprising:

a V-shaped elongated main body;

a first locking leg extending from a first end of the main body adapted for engaging with a retention frame on the printed circuit board, a second locking leg extending from an opposing second end of the main body adapted for engaging with the retention frame on the printed circuit board; and a resilient member comprising a planar-shaped supporting plate engaging with a bottom portion of the main body and at least one resilient foot extending downwardly from the supporting plate, the resilient foot being adapted for deforming to exert a resilient force on the heat sink when the securing device is used to mount the heat sink to the electronic component;

wherein the at least one resilient foot comprises a pair of resilient feet extending from opposite sides of the supporting plate, each of the resilient feet comprises a first bending portion extending downwardly and inwardly from an end of the supporting plate, and a planar second bending portion extending outwardly from an inner end of the first bending portion, the second bending portion being parallel to the supporting plate.

17. The securing device of claim 16, wherein two baffles extend upwardly from two opposite sides of the supporting plate, a receiving space being formed between the two baffles and above the supporting plate, the bottom portion of the main body being interferentially received in the receiving space.

18. The securing device of claim 16, wherein four protruding poles extend upwardly from four corners of the supporting plate, the main body defining an elongated cutout therein, the protruding poles being interferentially received in the elongated cutout of the main body, the bottom portion of the main body abutting against an outer edge of the supporting plate.

19. The securing device of claim 16, wherein front and rear edges of the resilient feet extend beyond those of the supporting plate, the main body defining an elongated cutout therein, the supporting plate being interferentially received in the elongated cutout, and the bottom portion of the main body abutting against the front and rear edges of the resilient feet.

* * * * *